(12) United States Patent
Rabl

(10) Patent No.: US 9,735,524 B1
(45) Date of Patent: Aug. 15, 2017

(54) THREE-LEVEL CONVERTER ARRANGEMENT AND CONNECTING ARRANGEMENT FOR SAME

(71) Applicant: SEMIKRON ELEKTRONIK GMBH & CO. KG, Nürnberg (DE)

(72) Inventor: Ingo Rabl, Zirndorf (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 15/468,367

(22) Filed: Mar. 24, 2017

(30) Foreign Application Priority Data

Mar. 30, 2016 (DE) .......................... 10 2016 105 779

(51) Int. Cl.
*H02M 1/00* (2006.01)
*H01R 25/16* (2006.01)
*H01R 4/30* (2006.01)

(52) U.S. Cl.
CPC ............. *H01R 25/167* (2013.01); *H01R 4/30* (2013.01); *H01R 25/162* (2013.01)

(58) Field of Classification Search
CPC .... H01L 25/112; H01L 25/115; H02M 7/003; H05K 1/145; H05K 1/183; H05K 1/184; H05K 1/185; H05K 7/005; H05K 7/02
See application file for complete search history.

(56) References Cited

U.S. PATENT DOCUMENTS

| 5,579,217 A | 11/1996 | Deam | |
|---|---|---|---|
| 2014/0111959 A1* | 4/2014 | Li | H05K 7/026 361/809 |
| 2015/0126052 A1* | 5/2015 | Yamkovoy | H01R 13/652 439/92 |

FOREIGN PATENT DOCUMENTS

DE  EP 2 814 308  12/2014

OTHER PUBLICATIONS

EP 2 814 308, German Examination Report, dated Mar. 30, 2016, 22 pages—German, 3 pages—English.

* cited by examiner

*Primary Examiner* — Adolf Berhane
*Assistant Examiner* — Afework Demisse
(74) *Attorney, Agent, or Firm* — Lackenbach Siegel, LLP; Andrew F. Young

(57) ABSTRACT

A connecting arrangement for a three-level converter arrangement includes a first to third connection rail which are each in the form of a shaped metal body. The respective connection rail has a line section and a connection section which has a connection means. The respective connecting rail has a line section and a connecting section which, for its part, has an associated respective connecting means. The respective connection means forms, with the connecting means, a force-fitting, electrically conductive connection. The connection rails are connected to the connecting rails with the correct polarity. The respective line sections of the connection rails and the connecting rails are situated one above the other in a stack, wherein the first connecting section, in projection in the normal direction of the first connection section, covers the first connection section; wherein the second connecting section, in projection in the normal direction of the second connection section, covers the first connection section and the second connection section, and wherein the third connecting section, in projection in the normal direction of the third connection section, covers the second connection section and the third connection section.

14 Claims, 5 Drawing Sheets

THREE-LEVEL CONVERTER ARRANGEMENT AND CONNECTING ARRANGEMENT FOR SAME

CROSS REFERENCE TO RELATED APPLICATIONS

This application relates to and claims priority from, German Ser. No.: DE 10 2016 105 779.7 filed Mar. 30, 2016, the entire contents of which are incorporated herein fully by reference.

FIGURE SELECTED FOR PUBLICATION

FIG. 3

BACKGROUND OF THE INVENTION

Field of the Invention

The invention describes a connecting arrangement for a three-level converter arrangement, and also the converter arrangement itself.

Description of the Related Art

EP 2 814 308 A1, the entire contents of which are incorporated herein by reference, discloses a three-level converter device comprising power semiconductor components, wherein the three-level converter device has, for making electrical contact, a first DC voltage positive potential connection element, a first DC voltage negative potential connection element and a first and a second neutral voltage potential connection element, wherein the first and the second neutral voltage potential connection elements are electrically conductively connected to one another, wherein the first DC voltage positive potential connection element and the first neutral voltage potential connection element form a first connection element pair, and the second neutral voltage potential connection element and the first DC voltage negative potential connection element form a second connection element pair, wherein the first and the second connection element pair are arranged in succession in a second direction in space, wherein the first DC voltage positive potential connection element and the first neutral voltage potential connection element are arranged one above the other in a third direction in space, and the second neutral voltage potential connection element and the first DC voltage negative potential connection element are arranged one above the other in the third direction in space.

With knowledge of these stated conditions, the invention is based on the below aspects and details and the object of forming a particularly compact configuration of the connecting arrangement, which has parasitic inductances which are as low as possible, in particular in the case of commutation with the neutral potential which provides substantial operational advantages.

ASPECTS AND SUMMARY OF THE INVENTION

According to one aspect of the present invention, there is provided a connecting arrangement for a three-level converter arrangement includes a first to third connection rail which are each in the form of a shaped metal body. The respective connection rail has a line section and a connection section which has a connection means. The respective connecting rail has a line section and a connecting section which, for its part, has an associated respective connecting means. The respective connection means forms, with the connecting means, a force-fitting, electrically conductive connection. The connection rails are connected to the connecting rails with the correct polarity. The respective line sections of the connection rails and the connecting rails are situated one above the other in a stack, wherein the first connecting section, in projection in the normal direction of the first connection section, covers the first connection section; wherein the second connecting section, in projection in the normal direction of the second connection section, covers the first connection section and the second connection section, and wherein the third connecting section, in projection in the normal direction of the third connection section, covers the second connection section and the third connection section.

According to one aspect of the present invention, this object is achieved by a connecting arrangement having the features noted and also by a converter arrangement.

The invention relates to a connecting arrangement for a three-level converter arrangement comprising a first to third connection rail which are each in the form of a shaped metal body, a first to third connecting rail which are each in the form of a shaped metal body. In this case, the respective connection rail has a line section and a connection section which, for its part, has a connection means. The respective connecting rail has a line section and a connecting section which, for its part, has an associated connecting means. The respective connection means forms, with the connecting means, a, preferably force-fitting, electrically conductive connection of the respectively associated connection section to the respectively associated connecting section. The connection rails are therefore connected to the connecting rails with the correct polarity. The respective line sections of the connection rails and the connecting rails are situated one above the other in the manner of a stack, wherein the first connecting section, in projection in the normal direction of the first connection section, covers the first connection section; wherein the second connecting section, in projection in the normal direction of the second connection section, covers the first connection section and the second connection section, and wherein the third connecting section, in projection in the normal direction of the third connection section, covers the second connection section and the third connection section.

In this case, it is preferred but not required that when the respective connection arrangement or means is in the form of a threaded pin, and the respective connecting means is in the form of a screw nut which fits this threaded pin.

It is particularly preferred when the connection rails are each in the form of a flat, unbent shaped metal body. In principle, independently of this, but preferably, the contact rails are each likewise in the form of a flat, unbent shaped metal body.

In a preferred configuration, the connection section is arranged in alignment with the line section of the respective connection rail. In this case, it is particularly advantageous when the second connection section is recessed in relation to the first connection section in the direction of the associated line section, and wherein the third connection section is recessed in relation to the second connection section in the direction of the associated line section.

Equally and, in particular, in combination, it is advantageous when the contact section is arranged such that it projects away from the line section of the respective contact rail at a right angle.

It is further preferred when the second contact section has a second recess, for arrangement of the first contact means, in alignment with the first connection means, and wherein the third contact section has a second recess, for arrangement of the second contact means, in alignment with the second connection means.

It is particularly preferred when the respective connection rails and associated connecting rails are electrically insulated from one another by insulating means, preferably insulating films or insulating sheathings. As an alternative, the distance between the respective pairs of connection rail and connecting rail can be selected such that this distance is sufficient in order to ensure electrical insulation.

It may be advantageous to form a cascaded connection when each connecting rail, for its part, has a connection section with a connection means.

In principle, it is preferred when the first connection rail and therefore also the first connecting rail carry negative or positive potential, the third connection rail and therefore also the third connecting rail carry positive or negative potential, that is to say the potential which is opposite to that of the first connection and connecting rail, and the second connection rail and therefore also the second connecting rail carry neutral potential.

The converter arrangement according to the invention is formed with a three-level power semiconductor system, comprising three, that is to say first to third, connection rails and comprising three, that is to say first to third, connecting rails, wherein the connection rails are electrically conductively connected to the associated connecting rails.

In this case, it is preferred when the three-level power semiconductor system has a three-level power semiconductor module. In addition, the three-level power semiconductor system can have a capacitor device and/or a driver device.

It goes without saying that, unless ruled out per se, the features mentioned in the singular may be present multiply in the switching device according to the invention or the converter arrangement. By way of example, the connection means or connecting means is at least one connection means or connecting means.

It goes without saying that the different configurations of the invention can be realized individually or in arbitrary combinations that are not mutually exclusive per se, in order to achieve improvements. In particular, the features mentioned and explained above and in the text which follows can be used not only in the combinations indicated, but also in other combinations or by themselves, without departing from the scope of the present invention.

Further explanations of the invention, advantageous details and features are evident from the following description of the exemplary embodiments of the invention illustrated schematically in FIGS. 1 to 9, or of respective parts thereof.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
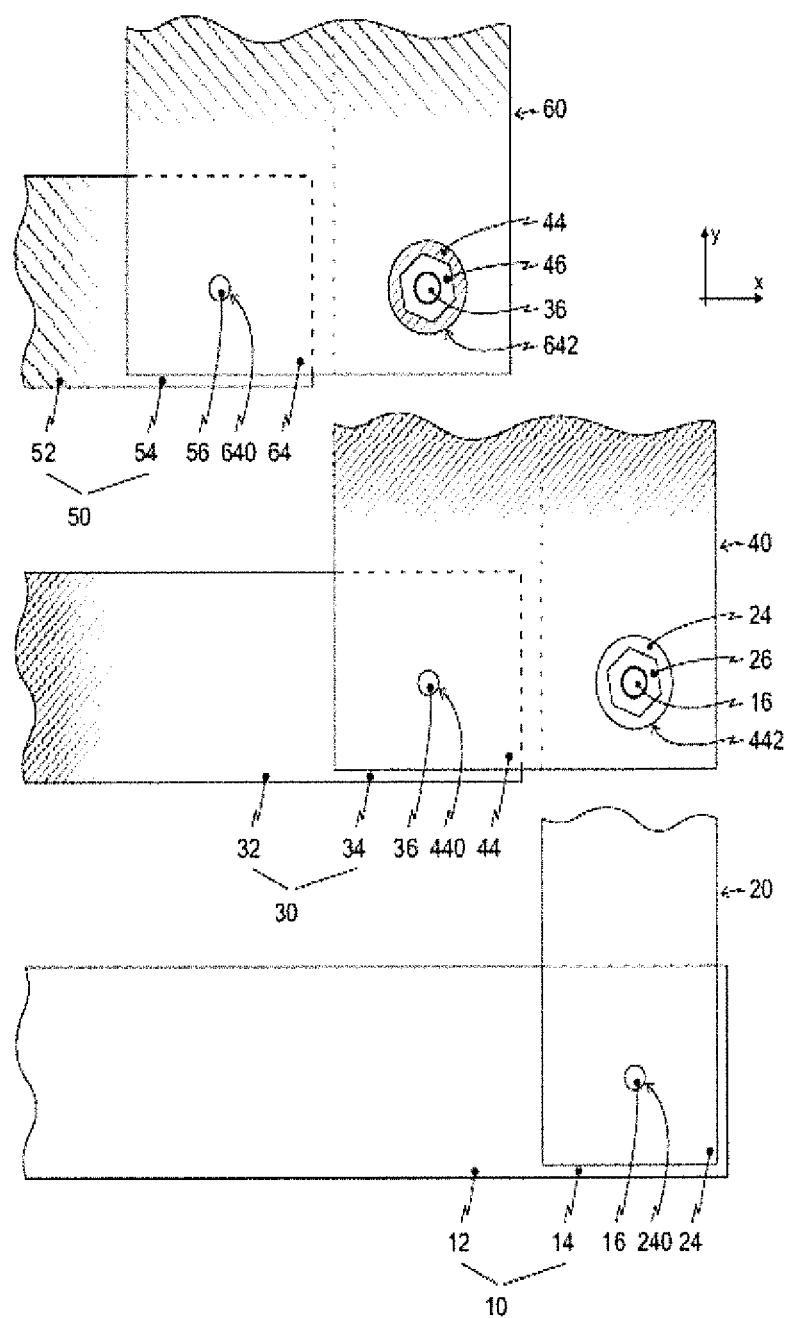
FIG. 1 shows plan views of the first, second and third connection rail and associated connecting rail of a connecting arrangement according to the invention separately from one another.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

It will be further understood by those of skill in the art that the apparatus and devices and the elements herein, without limitation, and including the sub components such as operational structures, circuits, communication pathways, and related elements, control elements of all kinds, display circuits and display systems and elements, any necessary connection structures, driving elements, inputs, sensors, detectors, memory elements, processors and any combinations of these structures etc. as will be understood by those of skill in the art as also being identified as or capable of operating the systems and devices and subcomponents noted herein and structures that accomplish the functions without restrictive language or label requirements since those of skill in the art are well versed in related devices, and all their sub components, without departing from the scope and spirit of the present invention.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

FIG. 1 shows plan views of the a first, second and third primary connection rails 10, 30, 50 and associated first, second, and third cooperative connecting rails 20, 40, 60 of a connecting arrangement according to the invention separately from one another. Here and in all of the following figures, the first connection rail 10 and connecting rail 20 are illustrated without hatching, while the second connection rail 30 and connecting rail 40 are illustrated with narrow hatching, and the third connection rail 50 and connecting rail 60 are illustrated with wide hatching. In some figures, the hatching is only partial, in order to not have an adverse effect on clarity. While described as primary or cooperative, all the connecting rails serve to connect, and the description used is for the purpose of assisting one of skill in the art for distinguishing the relative designations, which may be in any form or order mating the present description.

The first primary connection rail 10 is in the form of a flat unbent shaped metal body and carries positive potential here. The first connection rail has a line section 12 and a connection section 14 which adjoins the line section in direct alignment. The connection section 14 is that section which has a contact area for electrically conductive connection to an associated first connecting rail 20. Furthermore, the first connection section 14 has a connection means 16, here, cf. FIG. 2, configured as a threaded pin.

The first primary connection rail 10 has an associated first cooperative connecting rail 20, of which only the connecting section 24 is illustrated, the first connecting rail likewise being in the form of a flat unbent shaped metal body. the shaped metal body has a contact area to the first connection section 12 of the first connection rail 10, which contact area forms, with the contact area of the first connection section 14, the electrically conductive connection. The connecting section 24 has a first recess 240 through which the connection means 16 of the first connection rail 10 extends.

The second primary connection rail 30 is likewise in the form of a flat unbent shaped metal body and carries neutral potential here. The second connection rail has a line section 32 and a connection section 34 which adjoins the line section in direct alignment and is recessed in relation to that first connection section 14 which is arranged beneath it, also cf. FIGS. 2 and 3, in the direction of the line section 32. The connection section 34 is that section which has a contact area for electrically conductive connection to an associated second connecting rail 40. Furthermore, the second connection section 34 has a second connection means 36, once again configured as a threaded pin.

The second primary connection rail 30 has an associated second cooperative connecting rail 40, of which once again only the connecting section 44 is illustrated, the second connecting rail once again being in the form of a flat unbent shaped metal body. The shaped metal body has a contact area to the second connection section 34 of the second connection rail 30, which contact area forms, with the contact area of the second connection section 34, the electrically conductive connection. The second connecting section 44 has a first recess 440 through which the second connection means 36 of the second connection rail 30 extends.

Furthermore, the second connecting section 44 covers the first connecting section 24 and has, in this region of the covering, a second recess 442 into which the first connection means 16 of the first connection section 14 extends and there is connected to a first connecting means 26, which is in the form of a screw nut here. The force-fitting connection between the first connection section 14 and the first connecting section 24 and therefore the electrical connection of the two sections are effectively established as a result.

The third primary connection rail 50 is likewise in the form of a flat unbent shaped metal body and carries negative potential here. The third connection rail has a line section 52 and a connection section 54 which adjoins the line section in direct alignment and is recessed in relation to that second connection section 34 which is arranged beneath it, also cf. FIGS. 2 and 3, in the direction of the line section 52. The third connection section 54 is that section which has a contact area for electrically conductive connection to an associated third connecting rail 60. Furthermore, the third connection section 54 has a third connection means 56, once again configured as a threaded pin.

The third primary connection rail 50 has an associated third cooperative connecting rail 60, of which once again only the connecting section 64 is illustrated, the third connecting rail once again being in the form of a flat unbent shaped metal body. The shaped metal body has a contact area to the third connection section 54 of the third connection rail 50, which contact area forms, with the contact area of the third connection section 54, the electrically conductive connection. The third connecting section 64 has a first recess 640 through which the third connection means 56 of the third connection rail 50 extends.

Furthermore, the third connecting section 64 covers the second connecting section 44, but not the first connecting section 24, and has, in this region of the covering, a second recess 642 into which the second connection means 36 of the second connection section 34 extends and there is connected to a second connecting means 46, which is once again in the form of a screw nut here. The force-fitting connection between the second connection section 34 and the second connecting section 44 and therefore the electrical connection of the two sections are effectively established as a result.

Figure 3:
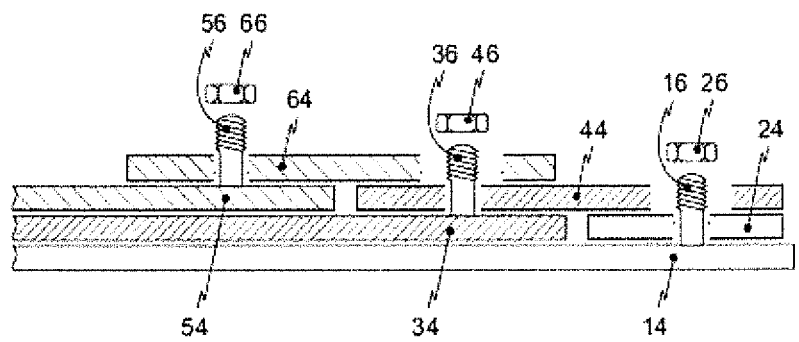
FIG. 3 likewise shows this connecting arrangement.

Cf. FIG. 3 in respect of forming the electrical connection between the third connection section and the third connecting section.

Figure 2:
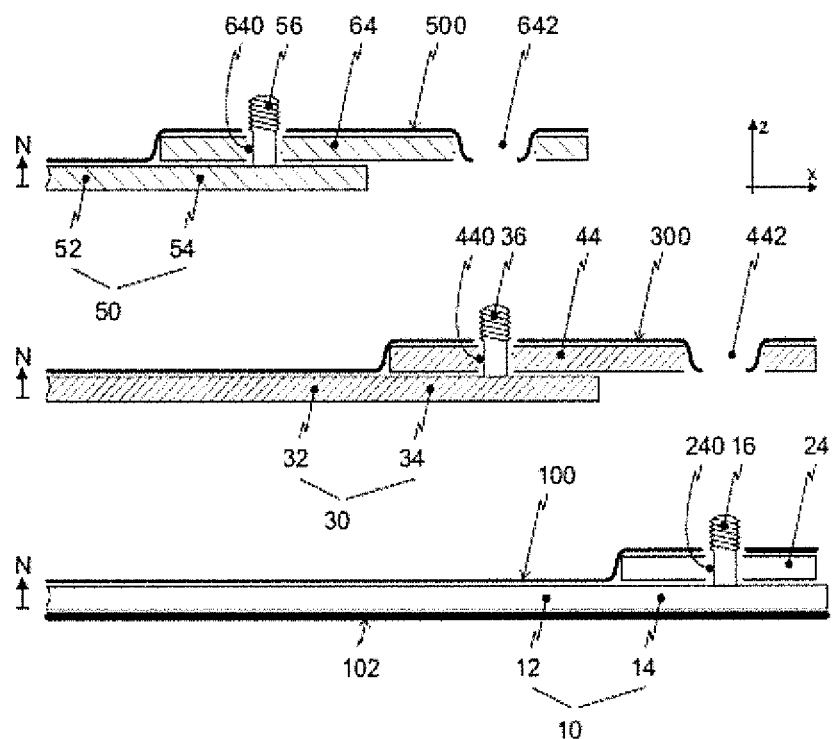
FIG. 2 shows a lateral exploded illustration of the first, second and third connection rail and associated connecting rail of a connecting arrangement according to the invention.

FIG. 2 shows a lateral exploded illustration of the first, second and third primary connection rails 10, 30, 50 and associated first, second, and third cooperative connecting rails 20, 40, 60 of a connecting arrangement according to the invention. The figure once again illustrates the first connection rail 10 with its line section 12 and its connection section 14 which has a connection means 16, in the form of a threaded pin, which projects away in the normal direction of the first connection rail 10, more precisely the first connection section 14. The first connection section 14 has an associated first connecting section 24 of the first connecting rail 20. The first connecting section has a first recess 240 for the first connection means 16 of the first connection section 14 to pass through. A respective insulating means 100, 102, in each case preferably in the form of an insulating film, is arranged both on the top side, which faces the second connection rail 30 and connecting rail 40, and also on the bottom side which is averted therefrom. The insulating film 100 of the top side serves to provide electrical insulation from the second connection rail 30 and connecting rail 40, while the insulating film 102 of the bottom side serves for electrical insulation from other potentials.

The figure further illustrates the second connection rail 30 with its line section 32 and its connection section 34 which has a second connection means 36, once again in the form of a threaded pin, which projects away in the normal direction of the second connection rail 30, more precisely the second connection section 34. The second connection section 34 is recessed in relation to the first connection section 14 in the direction of the associated second line section 32 by somewhat more than the width of the first connecting section 24, so that this second connection section comes to be situated next to the first connecting section 14, only offset by the height of the insulating means 100, cf. FIG. 3.

The second connection section 34 has an associated second connecting section 44 of the second connecting rail 40. The second connecting section has a first recess 440 for the connection means 36 of the second connection section 34 to pass through. The second connecting section 44 covers, in the normal direction N of the second connection rail 30, more precisely its connection section 34, connection section and also the first connection section 14. There, the second connecting section 44 has a second recess 442 through which the first connection means 16 extends. This second recess 442 is dimensioned in such a way that sufficient space is left for a first connecting means 26.

An insulating means 300, preferably in the form of an insulating film, is arranged on the top side which faces the third connection rail 50 and connecting rail 60. This insulating film 300 serves to provide electrical insulation from the third connection rail 50 and connecting rail 60.

The figure further illustrates the third connection rail 50 with its line section 52 and its connection section 54 which has a third connection means 56, once again in the form of a threaded pin, which projects away in the normal direction N of the third connection rail 50, more precisely the third connection section 54. The third connection section 54 is recessed in relation to the second connection section 34 in the direction of the associated third line section 52 to such an extent that this third connection section 54 comes to be situated next to the second connecting section 44, only offset by the height of the insulating means 300, cf. FIG. 3.

The third connection section 54 has an associated third connecting section 64 of the third connecting rail 60. The third connecting section has a first recess 640 for the third connection means 56 of the third connection section 54 to pass through. The third connecting section 64 covers, in the normal direction N of the third connection rail 50, more precisely its connection section 54, the connection section and also the second connection section 34, but to a lesser extent than the second connection section covers the first connecting section 14. In this region in which the third connecting section 64 covers the second connecting section 44, the third connecting section 64 has a second recess 642 through which the second connection means 34 extends. This second recess 642 is dimensioned in such a way that sufficient space is left for a second connecting means 46.

An insulating means 500, preferably in the form of an insulating film, is arranged on the top side of the third connection rail 50 and connecting rail 60. The insulating film 500 of the top side serves to provide electrical insulation from other potentials.

FIG. 3 likewise shows the connecting arrangement according to FIG. 2, but without the insulating means, and additionally with first to third connecting means 26, 46, 66 which are illustrated at a distance from one another. The force-fitting connection between the connection section and the respectively associated connecting section and therefore the electrical connection of the two sections are effectively established by means of these connecting means, more precisely by the respective arrangement of the connecting means on the associated connection means 16, 36, 56, that is to say specifically by the screw connection of the screw nut to the associated threaded pin.

It is preferred, as shown in part here, for the respective line sections of the connection rails 10, 30, 50 and the connecting rails 20, 40, 60 to be situated one above the other in the manner of a stack. In this case, the first connecting section 24, in projection in the normal direction N of the first connection rail 10, covers the first connection section 14. The second connecting section 44, in projection in the normal direction N of the second connection rail 30, covers the first connection section 14 and the second connection section 34. Analogously, the third connecting section 64, in projection in the normal direction N of the third connection rail 50, covers the second connection section 34 and the third connection section 54.

Figure 4:
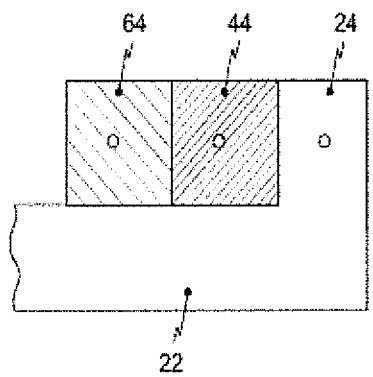
FIG. 4 shows a detail of the first to third connecting rails from below.

FIG. 4 shows a detail of the first to third connecting rails 20, 40, 60 from below, that is to say looking in the z-direction, cf. FIG. 2 or 3. The FIG. 4 shows the respective contact areas of the respectively first, second and third connecting section 24, 44, 64 and also the first line section 22 of the first connecting rail 10 projecting away from the associated connecting section 24 at a right angle, and in this case the entire connecting rail 20 is planar, that is to say unbent, and flat.

Figure 5:
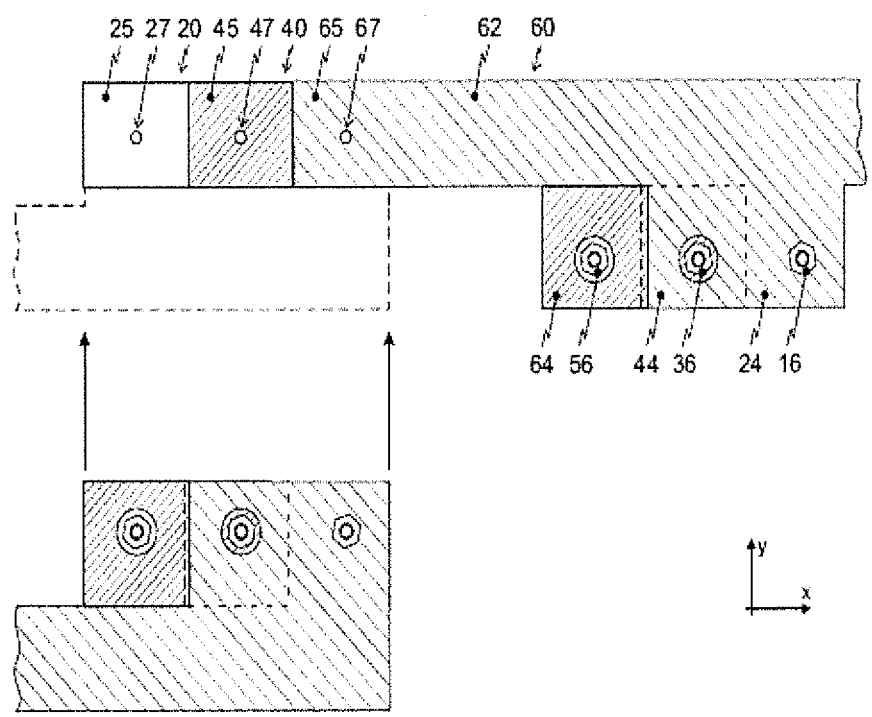
FIG. 5 shows a further configuration of a first to third connecting rail in plan view.

FIG. 5 shows a further configuration of first to third connecting rails 20, 40, 60 in plan view. The figure illustrates the first connecting rail 20 as a flat unbent shaped metal body in which the connecting section 24 extends perpendicularly away from a line section 22. The second and third connecting rails 40, 60 are arranged in the manner of a stack, in a manner otherwise known from the preceding figures. The second and third connecting rails, for their part, have connecting sections 44, 64 which are likewise arranged in the manner of a stack.

In the figure, the second connecting section 44 completely covers the first connecting section. The third connecting section 64 partially covers the second connecting section, wherein that region of the second connecting section 44 which completely covers the first connecting section 24 is not covered by the third connecting section 64. This ensures that, firstly, even in the case of a stacked arrangement of all of the connecting rails 20, 40, 60, there is access to all of the connecting means 26, 46, 66 and, at the same time, a low-inductance configuration of the arrangement comprising the three connecting rails is achieved by the described covering of individual connecting sections as part of the connecting rails.

The illustrated connecting rails can each have a plurality of connecting sections, cf. FIGS. 6 to 9.

Furthermore, each connecting rail, for its part, in alignment with its line section, has a connection section 25, 45, 65 with a connection means 27, 47, 67, as a result of which it is possible to cascade a plurality of first to third connecting rails, as is intended to be illustrated by the second arrangement of connecting rails.

FIGS. 6 to 9 show a converter arrangement according to the invention and the arrangement of the first to third connecting rails 20, 40, 60 in the converter arrangement. Here, the respective connection rails 10, 30, 50 and connecting rails 20, 40, 60 are in the form of flat shaped metal bodies, preferably composed of copper or a predominantly copper-containing alloy. The connection rails 10, 30, 50 have, at least in their connection section 14, 34, 54, a typical width of 3 cm to 15 cm and a thickness of between 0.4 cm and 2 cm. The connecting rails 20, 40, 60 preferably have the same thickness as the connection rails. The width of their respective line sections 22, 42, 62 is likewise preferably in the range of from 3 cm to 15 cm. These are typical and preferred configurations which do not fundamentally restrict the scope of the invention.

The first to third primary connection rails 10, 30, 50 form a stack with insulating means 100, 300 arranged therebetween, wherein the connection sections 14, 34, 54 are arranged bent through 90° in relation to the line sections 12, 32, 52. Therefore, a stack of these connection sections is formed, as is fundamentally known from FIG. 3.

Figure 6:
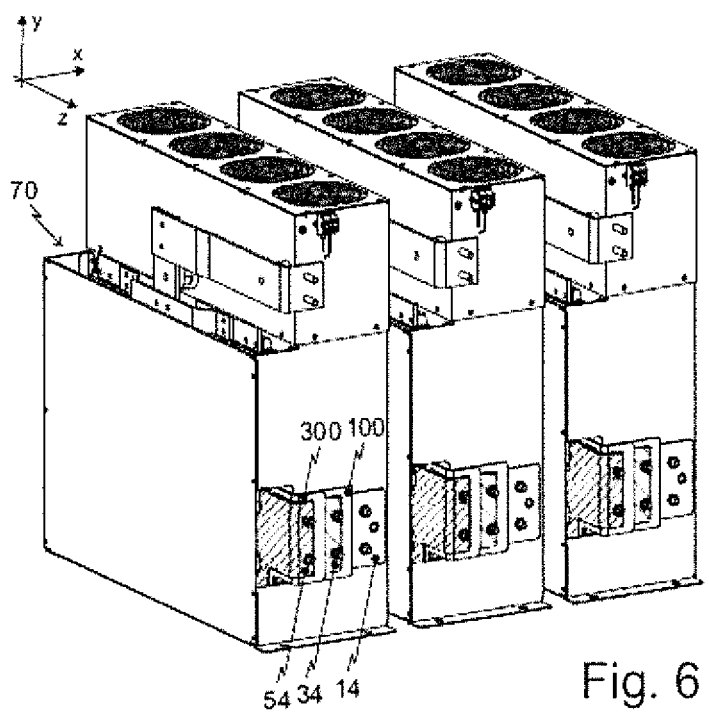
FIGS. 6 to 9 show a converter arrangement according to the invention and the arrangement of the first to third connecting rails in same.

FIG. 6 shows the converter arrangement, comprising three three-level power semiconductor systems 70, without connecting rails but only with first to third primary connection rails 10, 30, 50 which are connected to one another in accordance with the circuitry by way of a capacitor device and a plurality of three-level power semiconductor modules. Each three-level power semiconductor system 70 has, without being explicitly shown, a driver device for driving the power semiconductor modules. The primary connection rails 10, 30, 50 form, together with the respective capacitor device, the intermediate circuit of the respective three-level power semiconductor system 70.

Figure 7:
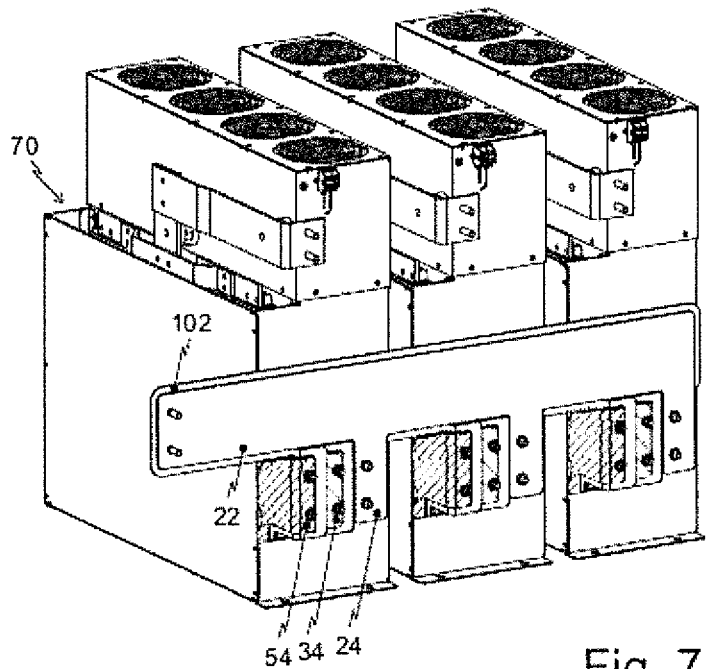

FIG. 7 shows the converter arrangement according to FIG. 6 with a first connecting rail 20 provided. In addition, an insulating means 102 in the form of an insulating film, for providing electrical insulation from the three-level power semiconductor system 70, is arranged on the bottom side of this first connecting rail 20.

Figure 8:
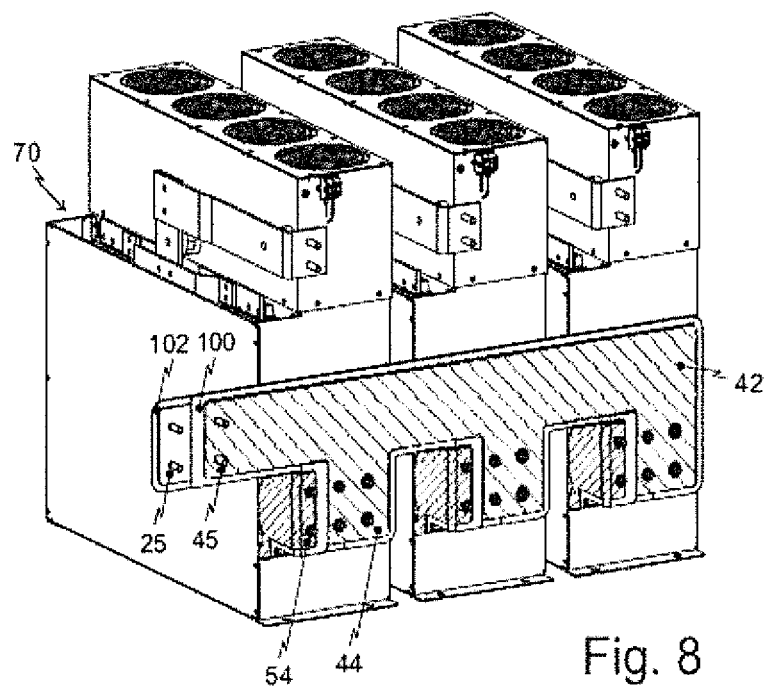

FIG. 8 shows the converter arrangement according to FIG. 7 with a second connecting rail 40 provided. In addition, an insulating means 100 in the form of an insulating film, for providing electrical insulation from the second connecting rail 20, is arranged on the top side of the first connecting rail 20.

Figure 9:
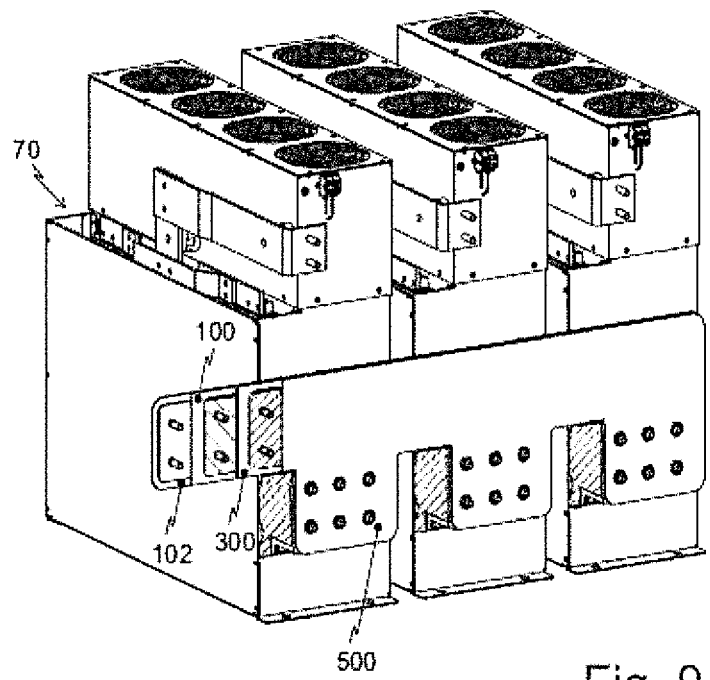

FIG. 9 shows the converter arrangement according to FIG. 8 with a third connecting rail 60 provided. In addition, an insulating means 300 in the form of an insulating film, for providing electrical insulation from the third connecting rail 60, is arranged on the top side of the second connecting rail 40. An insulating means 500 for providing electrical insulation of other potentials is likewise arranged on the third connecting rail.

The configuration illustrated and described above has the effect that the first connecting section 24, in projection in the normal direction N of the first connection section 14, which corresponds to the z-direction here, covers the first connection section 14. Similarly, the second connecting section 44, in projection in the normal direction N of the second connection section 34, covers the first connection section 14 and the second connection section 34. Furthermore, the third connecting section 64, in projection in the normal direction N of the third connection section 54, covers the second connection section 34 and the third connection section 54.

It will be understood by those of skill in the particular art, that as used herein the Normal direction (N) is a direction generally projecting away from or perpendicular to the other member (see for non-limiting example, FIG. 2), cooperative connection rails 20, 40, 60 have cooperative line sections and cooperative connecting sections; or the primary connection sections 14, 34, 54, have respective cooperative primary connecting sections.

It will be further understood by those of skill in the particular art, having considered the figures, that as used herein the respective elements for each arrangement of connection rails (primary or cooperative) or their respective components, may be similarly described as 'primary' or 'cooperative' without departing from the scope of the overall disclosure as such phrases are used descriptively and without other limitation.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A connecting arrangement for a three-level converter arrangement, comprising:
   a first, second, and third primary connection rail (10, 30, 50) which are each in the form of a shaped metal body;
   a first, second, and third cooperative connecting rail (20, 40, 60) which are each in the form of a shaped metal body;
   wherein respective said respective primary connection rails (10, 30, 50), further comprise:
      respectively a first, second, and third primary line sections (12, 32, 52) and respectively a first, second, and third primary connection section (14, 34, 54) which, for their parts, have respectively a primary connection means (16, 36, 56);
   wherein respective said cooperative connecting rails (20, 40, 60) further comprise:
      respectively a first, second, and third cooperative line section (22, 42, 62) and respectively a first, second, and third cooperative connecting section (24, 44, 64) which fir their parts, have respectively an associated first, second, and third cooperative connecting means (26, 46, 66);
   wherein each respective primary connection sections (14, 34, 54) forms, with the respective cooperative connecting means (26, 46, 66), an electrically conductive connection between each of the respectively associated primary connection sections (14, 34, 54) to the respectively associated cooperative connecting section (24, 44, 64);
   wherein the respective primary line sections of the connection rails (10, 30, 50) and the cooperative connecting rails (20, 40, 60) are situated one above the other forming a stack;
   wherein the first cooperative connecting section (24), covers the first primary connection section (14) in projection in a normal direction (N) of the first primary connection section (14);
   wherein the second cooperative connecting section (44), covers the first primary connection section (14) and the second primary connection section (34) in projection in the normal direction (N) of the second primary connection section (34), and
   wherein the third cooperative connecting section (64), covers the second primary connection section (34) and the third primary connection section (54) in projection in the normal direction (N) of the third primary connection section (54).

2. The connecting arrangement, according to claim 1, wherein:
   each of the respective primary connection means (16, 36, 56) is in the form of a threaded pin, and each of the respective cooperative connecting means (26, 46, 66) is in a form of a screw nut which fits each respective said threaded pin.

3. The connecting arrangement, according to claim 2, wherein:
   each of the primary connection rails (10, 30, 50) are each in the form of a flat and unbent shaped metal body.

4. The connecting arrangement, according to claim 3, wherein:
each of the cooperative connecting rails (20, 40, 60) are each in the form of a flat and unbent shaped metal body.

5. The connecting arrangement, according to claim 2, wherein:
each of the primary connection sections (14, 34, 54) is arranged in alignment with the primary line section (12, 32, 52) of the respective primary connection rail (10, 30, 50).

6. The connecting arrangement, according to claim 5, wherein:
the second primary connection section (34) is recessed in relation to the first primary connection section (14) in the direction of the associated second primary line section (32), and wherein the third primary connection section (54) is recessed in relation to the second primary connection section (54) in the direction of the associated primary line section (52).

7. The connecting arrangement, according to claim 5, wherein:
the each said cooperative connecting section (24, 44, 64) is arranged to project away from each said respective primary line section (12, 32, 52) of each respective said primary connection rail (10, 30, 50) at a right angle.

8. The connecting arrangement, according to claim 7, wherein:
the second cooperative connecting section (44) has a second recess (442), for arrangement of the first primary connecting means (26), in alignment with the first primary connection means (16), and wherein the third cooperative contact section (64) has a second recess (642), for arrangement of the second cooperative contact means (46), in alignment with the second primary connection means (36).

9. The connecting arrangement, according to claim 8, wherein:
the respective primary connection rails (10, 30, 50) and associated cooperative connecting rails (20, 40, 60) are respectively electrically insulated from one another by respective interspaced insulating means (100, 300); and
each said interspaced insulating means (100, 300) is in a firm of one of an insulating film and an insulating sheathing.

10. The connecting arrangement, according to claim 9, wherein:
each cooperative connecting rail (20, 40, 60), for its part, has a cooperative connection section (25, 45, 65) with a respective cooperative connection means (27, 47, 67).

11. The connecting arrangement, according to claim 2, wherein:
the first primary connection rail (10) and therefore also the first cooperative connecting rail (20) carry one of a negative and a positive potential;
the third primary connection rail (50) and therefore also the third cooperative connecting rail (60) carry the other of said positive and said negative potential; and
the second primary connection rail (30) and therefore also the second cooperative connecting rail (40) carry a neutral potential.

12. The converter arrangement, according to claim 1, further comprising:
a three-level power semiconductor system (70).

13. The converter arrangement, according to claim 12, wherein:
the three-level power semiconductor system (70), further comprises:
a three-level power semiconductor module.

14. The converter arrangement, according to claim 13, wherein:
the three-level power semiconductor system (70), further comprises:
at least one of a capacitor device and a driver device.

* * * * *